United States Patent [19]

Larson et al.

[11] Patent Number: 5,474,798
[45] Date of Patent: Dec. 12, 1995

[54] METHOD FOR THE MANUFACTURE OF PRINTED CIRCUIT BOARDS

[75] Inventors: Gary B. Larson, Cheshire; Donna Kologe, Thomaston; Cynthia Retallick; Jon Bengston, both of West Hartford, all of Conn.

[73] Assignee: MacDermid, Incorporated, Waterbury, Conn.

[21] Appl. No.: 296,706

[22] Filed: Aug. 26, 1994

[51] Int. Cl.⁶ .................................................. B05D 1/32
[52] U.S. Cl. ............................ 427/58; 427/96; 427/97; 427/98; 427/125; 205/125; 205/126; 216/12; 216/17; 216/92; 216/105
[58] Field of Search ............................ 427/58, 96, 97, 427/98, 125; 205/125, 126, 920; 156/625, 666, 901

[56] References Cited

U.S. PATENT DOCUMENTS

| | | | |
|---|---|---|---|
| 3,993,799 | 11/1976 | Feldstein | 427/53 |
| 4,002,778 | 1/1977 | Bellis et al. | 427/98 |
| 4,232,060 | 11/1980 | Mallory, Jr. | 427/98 |
| 4,373,656 | 2/1983 | Parker, Jr. et al. | 228/203 |
| 4,804,615 | 2/1989 | Larson et al. | 430/314 |
| 4,847,114 | 7/1989 | Brasch et al. | 427/96 |
| 4,897,118 | 1/1990 | Ferrier et al. | 106/1.11 |
| 5,092,967 | 3/1992 | Guess | 205/126 |
| 5,219,292 | 6/1993 | Dickirson et al. | 439/67 |
| 5,235,139 | 8/1993 | Bengston et al. | 174/251 |
| 5,238,550 | 8/1993 | Burress | 205/187 |
| 5,348,590 | 9/1994 | Shigemura et al. | 148/23 |

*Primary Examiner*—Shrive Beck
*Assistant Examiner*—Brian K. Talbot
*Attorney, Agent, or Firm*—John L. Cordani

[57] ABSTRACT

The present invention relates to a process for the manufacture of printed circuit boards. The method contemplates the use of electroless nickel as the primary medium for interconnection, for building circuitry to the desired thickness and as an etch resist. The method is particularly versatile in reducing the number of steps and variety of chemicals currently necessary to produce these circuit boards.

13 Claims, No Drawings

METHOD FOR THE MANUFACTURE OF PRINTED CIRCUIT BOARDS

FIELD OF INVENTION

The present invention relates to a process for the manufacture of double-sided and multi-layer printed circuit boards. The method proposed contemplates the use of electroless nickel for providing the necessary interconnections for building the circuitry to the desired thickness and as an etch resist. The method is particularly versatile in reducing the number of steps and variety of chemicals currently necessary to produce these circuit boards.

BACKGROUND OF INVENTION

In the manufacture of printed circuit boards, it is now commonplace to produce printed circuitry on both sides of a planar rigid or flexible insulating substrate. Of increased importance is the manufacture of multi-layer printed circuits which consist of parallel, planar, alternating inner layers of insulating substrate material and conductive metal. The exposed outer sides of the laminated structure are provided with circuit patterns, as with double-sided boards, and the inner layers themselves may contain circuit patterns.

In double-sided and multi-layer printed circuit boards, it is necessary to provide conductive interconnection between and among the various layers and/or sides. This is commonly achieved by providing copper plated through-holes. Copper is provided in various ways such as by electroless or electrolytic deposition or combinations thereof.

In terms of providing the desired circuit pattern on the board, the art has developed a variety of manufacturing sequences, many of which fall into the broad categories of substractive or additive techniques. Common to the subtractive processes is the need to etch away (or subtract) metal to expose the desired circuit patterns. Additive processes, on the other hand, begin with clean dielectric substrate surfaces and build up thereon metallization in desired areas only, the desired areas being those not masked by a previously applied pattern of plating resist material. While avoiding the problems associated with the etching required in substractive processes, additive processes have their own inherent difficulties in terms of the choice of resist materials, the ability to build up the full metallization thickness desired by electroless methods, the relatively long time periods required to electrolessly build the desired thickness' and weaknesses in the physical properties of most electroless copper, deposits.

U.S. Pat. No. 4,897,118 (Ferrier et. al), whose teachings are incorporated herein by reference, reveals a process for selective metallization a substrate in a predetermined desired pattern (i.e. additive technology). Ferrier et. al. discussed additive technology, propose certain improvements thereto, and give a fair picture of the current state-of-the-art in this area. The current invention proposes improvements thereto which provide significant advantages in reducing the number of steps and chemicals involved in the fabrication thereby making the fabrication process more economical and feasible.

SUMMARY OF THE INVENTION

The present invention proposes an improved process for the manufacture of printed circuit boards. The method provides various advantages over the prior art, including reduced number of cycle steps, reduced number of necessary chemical treatments, and increased manufacturing efficiency. This method thus overcomes many of the difficulties experienced with prior methods.

The method currently proposed contemplates the use of electroless nickel as the primary medium for interconnection, for building circuitry to thickness and as an etch resist. The following basic production cycle is proposed for implementation of this invention:

1. Drill holes
2. Activate holes
3. Apply plating mask
4. Clean exposed board surfaces
5. Initiate plating with nickel-boron strike
6. Plate electroless nickel to desired thickness (approx. 800 microinches)
7. Strip plating resist
8. Etch exposed copper surfaces Various optional steps may be added to this basic cycle to suit the particular needs of the fabricator. For example, solder mask and/or final finishes may be provided subsequent to Step 8. In addition, an electroless copper step may optionally be added between Steps 4 and 5.

DETAILED DESCRIPTION OF THE INVENTION

The present method is an improvement upon the additive techniques for the production of printed circuits. The present invention proposes a type of semi-additive technique. The invention addresses many, if not all, of the concerns and problems experienced by past techniques through the use of electroless nickel, preferably electroless nickel-phosphorous, instead of electroless copper as the primary material for providing through-hole interconnects and for building circuitry to the desired thickness.

The prior art additive processes suffered from a variety of problems. Firstly, most plating masks currently used in the industry are strippable in alkaline solutions. Electroless copper baths are invariably alkaline, usually very alkaline, with pH's in excess of 12. Therefore, known plating resists have great difficulty in maintaining their integrity and adhesion to the board surface when subjected to plating in electroless copper baths, particularly when the long plating periods required by these techniques (8 to 24) hours are taken into consideration. When the plating mask losses it integrity and/or adhesion to the surface, circuit definition fails. Secondly, the plating rates of electroless copper baths are relatively slow, usually averaging about 60 to 80 microinches per hour. In comparison, electroless nickel plating rates are bout 5 times faster, averaging about 350 microinches per hour. Thus, the production rate utilizing electroless nickel can be approximately 5 times that of electroless copper. In addition, the electroless nickel composition proposed herein possess physical properties that have been optimized to withstand the rigorous conditions many printed circuit boards are put through.

Electroless copper compositions contain formaldehyde, a suspected carcinogen which has plagued the printed circuit industry for years. Thus, the present invention circumvents these dangers through the use of electroless nickel which does not contain formaldehyde. Finally, this invention proposes a new cycle for the production of printed circuit boards. The new cycle is much shorter and less labor intensive then previous cycles. The proposed cycle also involves fewer, less dangerous chemicals and is more efficient in operation than previously proposed cycles. The present invention proposes the following basic cycle for the production of double-sided and multi-layer printed circuit boards:

1. Drill holes
2. Activate holes
3. Apply plate mask
4. Clean exposed board surfaces
5. Initiate plating with nickel boron strike
6. Plate electroless nickel to 800 microinches (desired thickness)
7. Strip the plating resist
8. Etch exposed copper The first step calls for holes to be drilled (or punched) in copper clad laminate (double-sided) or a laminated multi-layer package. The method and conditions for drilling, punching, or otherwise forming the holes is well known in the art.

The holes are then activated to accept plating. Activation of the holes can range in complexity from a single dip in a precious metal activator (or other non-precious metal activators known in the art) to a full desmear (or etchback), plated through-hole cycle involving numerous steps. The most complex hole activation cycle might consist of hole condition (m-Pyrol), potassium permanganate desmear, neutralization (acid/reducer), glass etch (Ammonium Bifluoride), conditioner (surfactant), microetch (sulfuric acid/hydrogen peroxide), activator ($PdCl_2$/Sn $Cl_2$ Colloid) and accelerator. Clean water rinses are interposed between each chemical treatment. Regardless of which hole activation cycle is chosen, its primary purpose is to treat the holes so that the hole surfaces will initiate electroless plating. A wide variety of methods for achieving this are known in the art, any of which may advantageously be utilized here.

A plating mask is then applied to the surfaces of the board. Application of the plating mask can occur through various known methods such as lamination (dry film), screening or curtain coating. The mask is then imaged and developed to reveal a positive image of the circuitry. Thus, the surfaces (copper and holes) to be plated upon are exposed and the remaining surface is masked.

The board is then cleaned so that the exposed copper surfaces are free of mask residue and are active to accept plating there upon. This may occur through the application of a single cleaner followed by rinsing. If a single cleaner is utilized, the cleaner should be formulated such that it removes a small amount of copper from the surface for proper activation (microetching). Alternatively, the cleaner may be followed by a separate microetchant (e.g. Sulfuric acid and hydrogen peroxide). Cleaning is most preferably achieved through the application of an acid cleaner which both microetches and cleans, followed by a fresh water rinse.

The next step is to initiate plating with a nickel boron strike. The composition of electroless nickel-boron baths is well-known in the industry an example is as follows:

| Component | Concentration |
| --- | --- |
| Nickel Sulfate | 20 g/l |
| Dimethyl Amine Borane | 20 g/l |
| Ammonium Hydroxide | 20 g/l |
| Water | Balance |

The board is then immersed in the nickel boron bath for a time and at a temperature effective to plate form 0.1 to 10 microinches of electroless nickel-boron on the exposed surfaces.

The nickel-boron strike is followed by an electroless nickel-phosphorous bath. Electroless nickel-phosphorous baths are widely known in the industry and any formulation can advantageously be utilized here. However, electroless nickel formulations which produce deposits with compressive internal stresses and which contain phosphorous contents above 8 percent by weight, are most desirable in printed circuit board applications. Compressively stressed nickel deposits have a lower tendency to crack and they perform well in almost every aspect of printed circuit board use.

Boards are treated in the electroless nickel-phosphorous bath for a time and at a temperature effective to plate approximately 300 to 5000 microinches of nickel onto the exposed surfaces. The boards are then cleaned and dried.

The plating mask is then stripped utilizing known techniques. Finally, the copper which was exposed by the stripping of the plating mask is etched away, thus defining the circuit patterns. Etching is accomplished through known means such as exposing the board to ammonical copper chloride final etchants, widely known in the industry. Note that the nickel serves the duel purposes of the primary hole conductor and etch resist.

Optionally, a solder mask can be employed at this point. In addition, if desired, other metals or final finishes can be provided for on the connectors, pads, and lands etc., to improve the solderability of these areas for the final soldering of components onto the board. These final finishes can be achieved through a variety of known techniques and may consist of any one or more of the following: Precious metal coating, non-precious metal coatings usually followed by an organic preservative coating, tin, tin-lead alloys, other coatings which preserve or enhance the solderability of these surfaces.

Finally, it may be desirable, as an option, to insert an additional step between Steps 4 (Clean exposed board surface) and 5 (Initiate plating with nickel boron strike) of the basic cycle. Some operators may prefer to initiate plating with electroless copper rather than the nickel boron strike. Therefore, one of a variety of known electroless copper baths may be utilized as the initial plating media as a Step 4(a). The copper would be followed by the nickel-boron and the remainder of the cycle as written. The advantage of employing electroless copper at this juncture is its ability to plate and cover certain surfaces better than nickel-boron. The main disadvantages are the addition of another step and another set of chemicals which contain the suspected carcinogen, formaldehyde.

This invention is further described in the following examples which are given for illustrative purposes only, and are in no way limiting.

EXAMPLE I

A printed circuit board was fabricated in the following manner according to the teachings of this invention:

1. Holes were drilled in a given pattern through a sized piece of laminate which was clad with copper foil on both sides.
2. The holes were activated to accept and initiate electroless plating on their surface with the following treatment:
    a) Cleaner/Conditioner (MacDermid 9420) for 4 minutes and at 110° F. by immersion therein.

b) Activation (MacDermid MACtivate 10) for 4 minutes and at 110° F. by immersion therein.
c) Dry
3. Application of plating mask to both surfaces of the board:
   a) MacDermid 9251 plating mask was screened on
   b) Bake the mask to dry
4. Clean exposed board surfaces:
   a) Clean using MacDermid 9271 by immersion therein for 3 minutes at 110° temperature.
5. Initiate plating with Nickel Boron Strike:
   a) Treatment of the board by immersion for 1 minute at 115° F. in MacDermid Electroless Nickel Boron. Two microinches of Nickel-Boron were plated.
6. Plate Electroless Nickel-Phosphorous
   a) Treatment of the board by immersion for 180 minutes at 190° F. in MacDermid Electroless Nickel-Phosphorous. 1150 microinches of nickel-phosphorus were plated.
7. Strip Plating Mask:
   a) Treatment of the board by immersion in MacDermid Resist Stripper for 3 minutes at 110° F.
8. Etch Exposed Copper:
   a) Treatment of the board using MacDermid Ultra Etch 50, ammonical copper chloride final etchant, by spray upon the surfaces thereof for approximately one (1) minute at 125° F.
   b) Dry Please note that fresh water rinses were interposed after each chemical operation given above.

EXAMPLE II

A printed circuit board was fabricated in the same manner as in Example I, except that after Step 8 thereof the board was further processed in the following manner:

1. Application of Solder Mask:
   a) MacDermid 6000 Solder Mask was applied to the surfaces of the board by curtain coating.
   b) The Solder Mask was then imaged using prepared artwork and ultraviolet radiation.
   c) The exposed solder mask was then developed using an aqueous solution of sodium carbonate (10 gr/l) for 3 minutes at 110° F., thereby revealing electrical connection areas such as holes, pads, lands, tabs and other connectors.
2. Final Finish
   a) The board was immersed in the MacDermid 9271 cleaner to clean and activate the exposed metallic surfaces for application of a final finish.
   b) The exposed nickel surfaces were then activated for plating thereon.
   c) The exposed surfaces were then plated with 20 microinches of electroless palladium by immersion in MacDermid Electroless Palladium bath for 20 minutes at 160° F.

EXAMPLE III

A printed circuit board was fabricated in the same manner as in Example II except that the following additional step was inserted between Steps 4 (clean exposed board surfaces) and 5 (initiate plating with nickel boron strike).

4(a). Electroless Copper
   a) The board was treated by immersion in MacDermid M-85 Electroless Copper bath for 15 minutes at 115° F. A total of 100 microinches of electroless copper were plated.

EXAMPLE IV

A multilayer printed circuit board was fabricated in the same manner as in Example III except that the starting material was a laminated multilayer package with copper cladding on both exterior surfaces and except that Step 2 was replaced by the following Step 2:

The holes were activated to accept and initiate electroless plating on their surfaces with the following treatment:
   a) Hole conditioner (MacDermid 9240) for 4 minutes at 100° F.
   b) Permanganate Desmear (MacDermid 9275) for 10 minutes at 160° F.
   c) Neutralizer (MacDermid 9279) for 5 minutes at 115° F.
   d) Cleaner/Conditioner (MacDermid 90) for 5 minutes at 110° F.
   e) Microetch (MacDermid G-4) for 2 minutes at 90° F.
   f) Preactivation (MacDermid 93) for 2 minutes at 90° F.
   g) Activation (MacDermid 95) for 5 minutes at 90° F.
   h) Accelerator (MacDermid 97) for 2 minutes at 100° F.

The printed circuit boards formed in all the above given examples were tested in a variety of ways including standard solder shock tests, conductivity tests, cross section tests, and various functional testing. The results of all testing revealed that all of the printed circuit boards produced, functioned acceptably, for the purposes intended.

What is claimed is:

1. A process for producing a printed circuit board, which process comprises the steps of:
   (a) Forming holes in a substrate which has copper cladding on both exterior surfaces;
   (b) Activating the holes to initiate and accept plating thereon;
   (c) Forming an image with a plating mask upon the exterior surfaces of the substrate, yielding masked surfaces and unmasked surfaces;
   (d) Cleaning the unmasked surfaces; thereafter
   (e) Plating the unmasked surfaces and the surfaces of the holes with an electroless nickel-boron deposit; thereafter
   (f) Plating electroless nickel-phosphorous deposits onto the nickel-boron deposits; thereafter
   (g) Stripping the plating mask to reveal exposed copper surfaces; and thereafter
   (h) etching to remove the exposed copper surfaces; wherein said process occurs substantially without copper plating.

2. A process according to claim 1 further comprising, after Step (h) of claim 1, the steps of:
   (a) Applying a solder mask to certain areas; and
   (b) Applying a final finish to any metallic areas not covered by the solder mask, which final finish enhances and protects the solderability of said metallic areas.

3. A process according to claim 1 wherein the electroless nickel-phosphorous deposit possesses compressive internal stresses.

4. A process according to claim 2 wherein the final finish is selected from the group consisting of palladium, gold, rhodium, tin, tin alloys, lead, lead alloys and copper.

5. A process according to claim 4 wherein the final finish is nickel which has been treated with an agent which protects and enhances the solderability of the nickel.

6. A process according to claim 5 wherein the agent is selected from the group consisting of benzotriazole, tolyltriazole, imidazoles and benzimidazoles.

7. A process for producing a printed circuit board, which process comprises the steps of:

(a) Forming holes in a substrate which has copper cladding on both exterior surfaces;

(b) Activating the holes to initiate and accept plating thereon;

(c) Forming an image with a plating mask upon the exterior surfaces of the substrate, yielding masked surfaces and unmasked surfaces;

(d) Cleaning the unmasked surfaces; thereafter (e) Plating the unmasked surfaces and the surfaces of the holes with an electroless nickel-boron deposit; thereafter (f) Plating electroless nickel-phosphorous deposits onto the nickel-boron deposits; thereafter (g) Stripping the plating mask to reveal exposed copper surfaces; and thereafter (h) etching to remove the exposed copper surfaces;

wherein said process occurs substantially without electrolytic copper plating.

8. A process according to claim 7 further comprising, after Step (h) of claim 7, the steps of:

(a) Applying a solder mask to certain areas; and (b) Applying a final finish to any metallic areas not covered by the solder mask, which final finish enhances and protects the solderability of said metallic areas.

9. A process according to claim 7 further comprising the step of:

(a) Plating the unmasked surfaces and the surfaces of the holes with electroless copper after Step (d), but before Step (e) of claim 7.

10. A process according to claim 7 wherein the electroless nickel-phosphorous deposit possesses compressive internal stresses.

11. A process according to claim 8 wherein the final finish is selected from the group consisting of palladium, gold, rhodium, tin, tin alloys, lead, lead alloys, and copper.

12. A process according to claim 11 wherein the final finish is copper which has been treated with an agent which protects and enhances the solderability of the copper.

13. A process according to claim 12 wherein the agent is selected from the group consisting of benzotriazole, tolyltriazole, imidazoles and benzimidazoles.

* * * * *